US009543542B2

(12) United States Patent
Kim et al.

(10) Patent No.: US 9,543,542 B2
(45) Date of Patent: Jan. 10, 2017

(54) ORGANIC LIGHT-EMITTING DISPLAY

(71) Applicant: Samsung Display Co. Ltd., Yongin, Gyeonggi-Do (KR)

(72) Inventors: Hyun Young Kim, Asan-si (KR); Ji Yong Park, Yongin-si (KR); Sung Ho Cho, Seoul (KR); Il Ryong Cho, Cheonan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 14/291,096

(22) Filed: May 30, 2014

(65) Prior Publication Data
US 2015/0060790 A1 Mar. 5, 2015

(30) Foreign Application Priority Data

Aug. 30, 2013 (KR) ........................ 10-2013-0104095

(51) Int. Cl.
*H01L 29/08* (2006.01)
*H01L 51/52* (2006.01)
*H01L 27/32* (2006.01)

(52) U.S. Cl.
CPC ....... *H01L 51/5246* (2013.01); *H01L 27/3225* (2013.01)

(58) Field of Classification Search
CPC ... H01L 27/32–27/326; H01L 51/50–51/5012; H01L 51/525–51/5287; H01L 2227/32–2227/326; H01L 2251/5323–2251/5361; H01L 2924/12044

USPC ............................... 257/79–103, 40, 59, 72, E51.001,257/E51.01; 438/99
See application file for complete search history.

(56) References Cited

U.S. PATENT DOCUMENTS

| 7,843,545 | B2* | 11/2010 | Jung ..................... G02F 1/1345 349/139 |
| 2005/0070039 | A1* | 3/2005 | Yamazaki .............. G09G 3/006 438/33 |
| 2005/0168339 | A1* | 8/2005 | Arai .................. G06K 19/07722 340/572.8 |
| 2008/0024415 | A1* | 1/2008 | Jung ................... G02F 1/13454 345/92 |
| 2008/0165315 | A1* | 7/2008 | Nishida .................. G02B 1/118 349/137 |
| 2009/0167171 | A1* | 7/2009 | Jung ................... H01L 51/5237 313/504 |

(Continued)

FOREIGN PATENT DOCUMENTS

| JP | 2004-362819 A | 12/2004 |
| KR | 1020050022538 A | 3/2005 |

(Continued)

*Primary Examiner* — Earl Taylor
*Assistant Examiner* — Samuel Park
(74) *Attorney, Agent, or Firm* — Cantor Colburn LLP

(57) ABSTRACT

An organic light-emitting display includes a first substrate which includes a pixel region, and an encapsulation region which surrounds the pixel region, an organic light-emitting device which is located in the pixel region, a sealant which is located in the encapsulation region, and a dummy metal which is interposed between the first substrate and the sealant, where the encapsulation region includes a first encapsulation region and a second encapsulation region which is adjacent to the first encapsulation region, and the dummy metal is located in the first encapsulation region.

16 Claims, 11 Drawing Sheets

(56) References Cited

U.S. PATENT DOCUMENTS

2013/0093731 A1* 4/2013 Scharff ................ G06F 1/1686
   345/177
2015/0022081 A1* 1/2015 Li ........................... H01Q 1/44
   315/34

FOREIGN PATENT DOCUMENTS

| KR | 1020050048133 A | 5/2005 |
| KR | 1020060055051 A | 5/2006 |
| KR | 1020080074242 A | 8/2008 |
| KR | 1020080077421 A | 8/2008 |

* cited by examiner

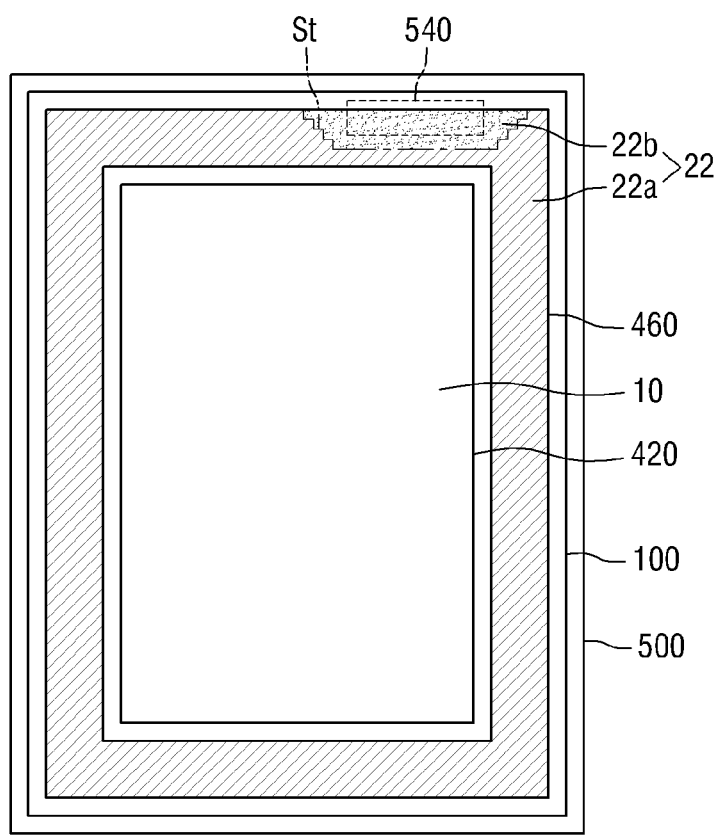

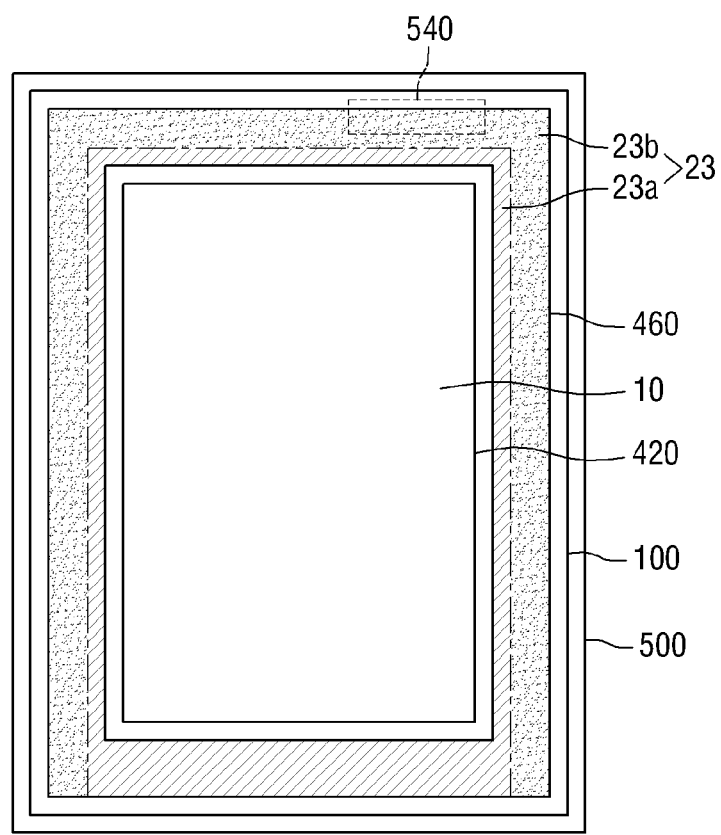

ORGANIC LIGHT-EMITTING DISPLAY

This application claims priority to Korean Patent Application No. 10-2013-0104095 filed on Aug. 30, 2013, and all the benefits accruing therefrom under 35 U.S.C. §119, the disclosure of which is incorporated herein by reference in its entirety.

BACKGROUND

1. Field

The invention relates to an organic light-emitting display.

2. Description of the Related Art

An organic light-emitting display ("OLED") is a display device that can display information such as images, text, etc. by using light generated when holes and electrons supplied respectively from an anode and a cathode combine in an organic layer interposed between the anode and the cathode.

Display properties of the OLED change sensitively to penetration of oxygen and moisture. Thus, encapsulation technology that can effectively prevent penetration of oxygen and moisture is required. One example of the encapsulation technology is to encapsulate edges of the OLED by interposing a sealant, such as glass frit, between an upper substrate and a lower substrate. Accordingly, it is possible to effectively prevent the penetration of oxygen and moisture into an organic light-emitting device and a thin-film transistor ("TFT") inside the OLED.

However, when the sealant, such as glass frit, alone is interposed between the upper substrate and the lower substrate of the OLED, there may be limitations on a mechanical strength of the OLED.

Therefore, a dummy metal may additionally be interposed between the sealant and the lower substrate to improve the mechanical strength of the OLED.

SUMMARY

When an antenna of the OLED is disposed on a dummy metal, the dummy metal may degrade a transmission and reception function of the antenna. A signal transmitted from the antenna to a base station or a signal transmitted from the base station to the antenna may be partially blocked by the dummy metal, thereby reducing a signal-processing sensitivity of the antenna, for example.

Exemplary embodiments of the invention provide an organic light-emitting display ("OLED") having improved transmission and reception sensitivity of an antenna and having a certain degree of mechanical strength ensured.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided an OLED including a first substrate which includes a pixel region and an encapsulation region surrounding the pixel region, an organic light-emitting device which is located in the pixel region, a sealant which is located in the encapsulation region, and a dummy metal which is interposed between the first substrate and the sealant, wherein the encapsulation region includes a first encapsulation region and a second encapsulation region which is adjacent to the first encapsulation region, and the dummy metal is located in the first encapsulation region.

In an exemplary embodiment, a width of the first encapsulation region in a region of the first substrate may be different from a width of the first encapsulation region in the other region of the first substrate.

In an exemplary embodiment, the first encapsulation region may be located in an inner side of the first substrate, and the second encapsulation region may be located in an outer side of the first substrate.

In an exemplary embodiment, a portion of the first encapsulation region may be interposed between the pixel region and the second encapsulation region.

In an exemplary embodiment, the dummy metal may be not located in the second encapsulation region.

In an exemplary embodiment, the OLED may further include an insulating layer which are interposed between the first substrate and the sealant, wherein an opening is defined in the insulating layers.

In an exemplary embodiment, the opening may includes a plurality of first openings which is located in the first encapsulation region, and a plurality of second openings which is located in the second encapsulation region, wherein a size of each of the plurality of first openings is different from a size of each of the plurality of second openings.

In an exemplary embodiment, a ratio of a total area of vertical surfaces of the second openings to a planar area of the second encapsulation region may be different from a ratio of a total area of vertical surfaces of the plurality of first openings to a planar area of the first encapsulation region.

In an exemplary embodiment, the OLED may further include an antenna which is located on the first substrate, wherein the organic light-emitting device and the sealant may be located on a surface of the first substrate, the antenna may be located on an opposite surface of the first substrate which faces the surface of the first substrate, and at least a portion of the antenna may be located in the second encapsulation region.

In an exemplary embodiment, the first encapsulation region may surround the antenna.

In an exemplary embodiment, at least a portion of a boundary line between the first encapsulation region and the second encapsulation region may be staircase-shaped.

In an exemplary embodiment, the OLED may further include a support layer which is located on the first substrate, located in the pixel region and the first encapsulation region, and includes a conductive material, wherein the organic light-emitting device and the sealant may be located on a surface of the first substrate, and the support layer may be located on an opposite surface of the first substrate which faces the surface of the first substrate.

In an exemplary embodiment, the support layer may be not located in the second encapsulation region.

In an exemplary embodiment, the organic light-emitting device may include a first electrode, a second electrode which is located in the first electrode, and an organic light-emitting layer which is interposed between the first electrode and the second electrode, wherein the dummy metal may include the same material as any one of the first electrode and the second electrode.

In an exemplary embodiment, the OLED may further include a thin-film transistor ("TFT") which is located in the pixel region of the first substrate, wherein the TFT may include a gate electrode, a source electrode and a drain electrode, and the dummy metal may include the same material as at least one of the gate electrode, the source electrode and the drain electrode.

In an exemplary embodiment, the OLED may further include a second substrate which faces the first substrate and is coupled to the first substrate by the sealant.

According to another exemplary embodiment of the invention, there is provided an OLED including a substrate which includes a pixel region and an encapsulation region surrounding the pixel region, an organic light-emitting device which is located in the pixel region, a sealant which is located in the encapsulation region, and a dummy metal which is interposed between the substrate and the sealant, wherein a width of a region including the dummy metal in a region of the substrate is smaller than a width of the region including the dummy metal in another region of the substrate.

In an exemplary embodiment, the OLED may further include an antenna which is located on the substrate, wherein the organic light-emitting device and the sealant are located on a surface of the substrate, and the antenna is located on an opposite surface of the substrate which faces the surface of the substrate and does not overlap the dummy metal.

According to still another exemplary embodiment of the invention, there is provided an OLED including a substrate, an organic light-emitting device which is located on a surface of the substrate, a sealant which is located on the surface of the substrate and surrounds the organic light-emitting device, a dummy metal which is interposed between the substrate and the sealant, and an antenna which is located on an opposite surface of the substrate which faces the surface of the substrate and does not overlap the dummy metal.

In an exemplary embodiment, the OLED may further include an insulating layer which are interposed between the substrate and the sealant, wherein an opening may be defined in an insulating layer, and at least a portion of the antenna overlaps the opening.

BRIEF DESCRIPTION OF THE DRAWINGS

The above and other exemplary embodiments and features of the invention will become more apparent by describing in detail exemplary embodiments thereof with reference to the attached drawings, in which:

FIGS. 9 through 11 are respectively plan views of other exemplary embodiments of OLEDs according to the invention.

DETAILED DESCRIPTION

Figure 1:
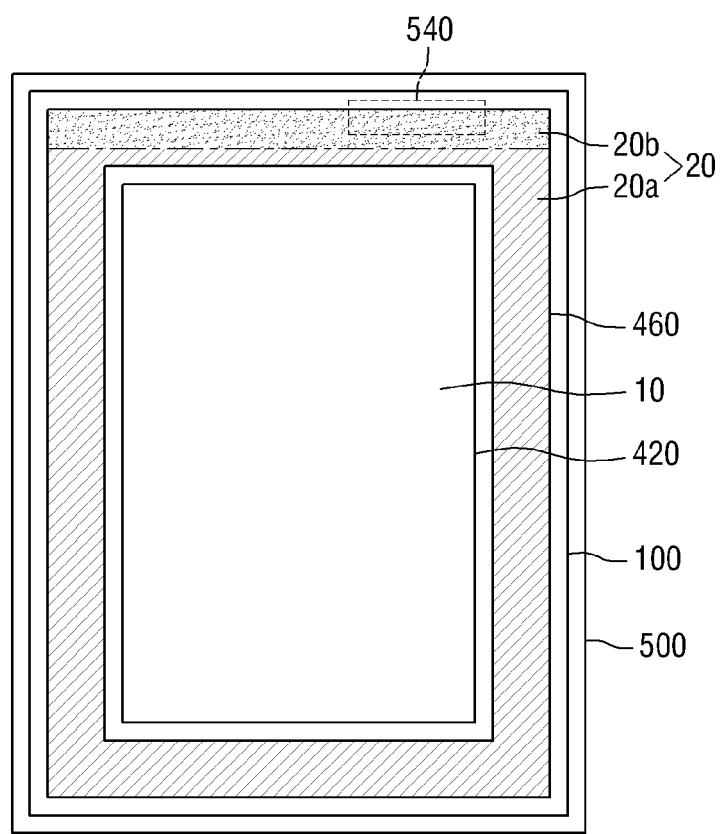
FIG. 1 is a plan view of an exemplary embodiment of an organic light-emitting display ("OLED") according to the invention.

The exemplary embodiments and features of the invention and methods for achieving the exemplary embodiments and features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. The invention will now be described more fully with reference to the accompanying drawings, in which exemplary embodiments of the invention are shown.

Figure 2:
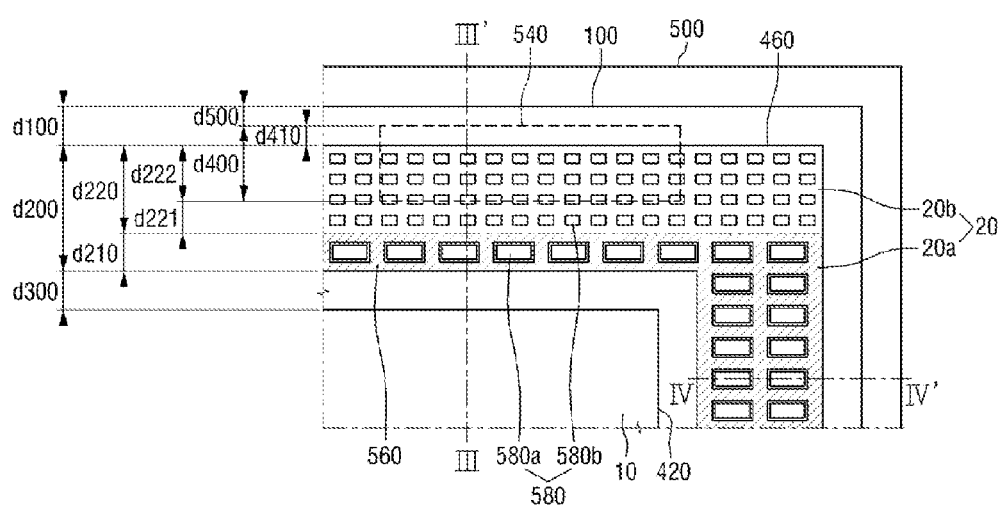
FIG. 2 is a partial enlarged view of the OLED shown in FIG. 1.
Figure 3:
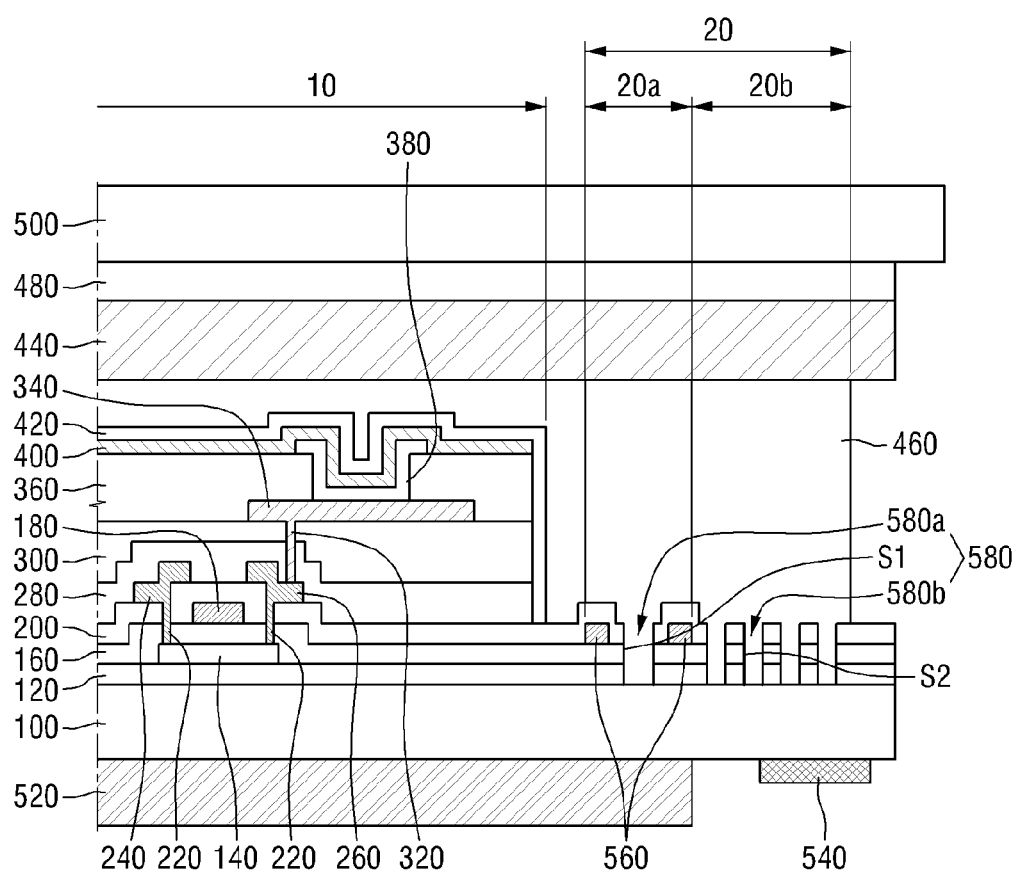
FIG. 3 is a cross-sectional view taken along line III-III' of FIG. 2.
Figure 4:
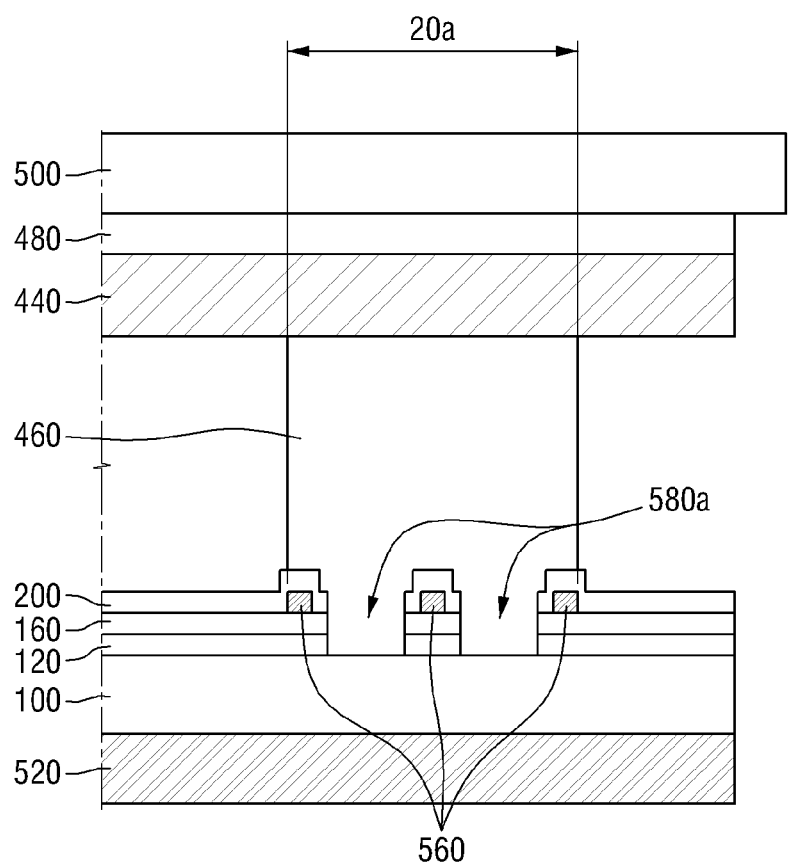
FIG. 4 is a cross-sectional view taken along line IV-IV' of FIG. 2.

FIG. 1 is a plan view of an organic light-emitting display ("OLED") according to an exemplary embodiment of the invention. FIG. 2 is a partial enlarged view of the OLED shown in FIG. 1. FIG. 3 is a cross-sectional view taken along line III-III' of FIG. 2. FIG. 4 is a cross-sectional view taken along line IV-IV' of FIG. 2.

Referring to FIGS. 1 through 4, the OLED according to the illustrated exemplary embodiment may include a first substrate 100, a buffer layer 120, a semiconductor pattern 140, a gate insulating layer 160, a gate electrode 180, an interlayer insulating film 200, contact holes 220, a source electrode 240, a drain electrode 260, an intermediate layer 280, a planarization layer 300, a via hole 320, a first electrode 340, a pixel defining layer 360, an organic light-emitting layer 380, a second electrode 400, a cover layer 420, a second substrate 440, a sealant 460, an adhesive layer 480, a window 500, a support layer 520, an antenna 540, a dummy metal 560, and a plurality of openings 580.

In the specification, an OLED will be described as an example. However, the invention is not limited to the OLED. That is, various other displays such as a liquid crystal display ("LCD"), an electrophoretic display, a field emission display ("FED"), a surface-conduction electron-emitter display ("SED"), a plasma display, a cathode ray tube display, etc. can also be used.

In an exemplary embodiment, the first substrate 100 may be shaped like a rectangular parallelepiped plate. A surface of the first substrate 100 may be flat, and various structures that constitute a display device may be disposed on the flat surface.

In an exemplary embodiment, the first substrate 100 may include a transparent insulating substrate. In the exemplary embodiment, the first substrate 100 may include a glass substrate, a quartz substrate, a transparent resin substrate, etc. In addition, the first substrate 100 may include a polymer with high thermal resistance. In an exemplary embodiment, the first substrate 100 may include any one material including at least one of polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate, cellulose acetate propionate ("CAP"), poly(aryleneether sulfone), and various combinations thereof.

In an exemplary embodiment, the first substrate 100 may have flexibility. That is, the first substrate 100 may include a deformable substrate that can be rolled, folded, bent, etc.

The first substrate 100 may include a pixel region 10 and an encapsulation region 20.

In an exemplary embodiment, the pixel region 10 may be a region where various devices for actually driving the OLED, such as organic light-emitting devices and thin-film transistors ("TFTs"), are located. In addition, the pixel region 10 may be a region where images are displayed. The pixel region 10 may be located in a middle of the first substrate 100.

In an exemplary embodiment, the encapsulation region 20 may be a region where the sealant 460 for encapsulating various devices that actually drive the OLED is located. In addition, the encapsulation region 20 may be adjacent to edges of the first substrate 100. That is, the encapsulation region 20 may be located in an edge portion of the first substrate 100. In addition, the encapsulation region 20 may surround the pixel region 10. In an exemplary embodiment, the encapsulation region 20 may be shaped like a quadrangular or circular donut that surrounds all boundaries of the pixel region 10.

The encapsulation region 20 may include a first encapsulation region 20a and a second encapsulation region 20b.

The first encapsulation region 20a may be a region where the dummy metal 560 is located. In addition, the first encapsulation region 20a may be located in an inner side of the first substrate 100. A portion of the first encapsulation region 20a may be interposed between the pixel region 10 and the second encapsulation region 20b. The first encapsulation region 20a may have a varying width taken along a vertical direction (e.g., line III-III' of FIG. 2) perpendicular to an elongated direction in a plan view. In an exemplary embodiment, the width of the first encapsulation region 20a in a region of the first substrate 100 taken along the vertical direction may be different from the width of the first encapsulation region 20a in another region of the first substrate 100 taken along the vertical direction. In an exemplary embodiment, a width of the first encapsulation region 20a in the region of the first substrate 100 may be smaller than a width of the first encapsulation region 20a in another region of the first substrate 100. In the exemplary embodiment of FIG. 1, the width of the first encapsulation region 20a adjacent to a side of the first substrate 100 may be smaller than the width of the first encapsulation region 20a adjacent to the other sides of the first substrate 100. Here, the first encapsulation region 20a having the smaller width may be adjacent to the antenna 540 but may not overlap the antenna 540.

The second encapsulation region 20b may be adjacent to the first encapsulation region 20a. In addition, the second encapsulation region 20b may be a region where the dummy metal 560 is not located. The second encapsulation region 20b may be located in an outer side of the first substrate 100. The second encapsulation region 20b may not be located in the inner side of the first substrate 100. The second encapsulation region 20b may overlap at least part of the antenna 540.

The positional relationship between the pixel region 10 and the encapsulation region 20 will now be described with reference to FIG. 2. Reference characters d100, d200, d210, d220, d221, d222, d300, d400, d410, and d500 may respectively indicate certain distances as will be described below.

A width of the encapsulation region 20 may be greater than a distance between an edge of the first substrate 100 and the encapsulation region 20 and a distance between the pixel region 10 and the encapsulation region 20. In FIG. 2, the width of the encapsulation region 20 is d200. The encapsulation region 20 may be separated from the edge of the first substrate 100 by d100 and from the pixel region 10 by d300. In an exemplary embodiment, d200 may be approximately three times d100, and d300 may be substantially equal to d100. In an exemplary embodiment, d200 may be about 700 micrometers (μm), and d100 and d300 may be about 250 μm.

The width of the first encapsulation region 20a adjacent to the antenna 540 may be smaller than the width of the second encapsulation region 20b which overlaps at least part of the antenna 540. In FIG. 2, the width of the first encapsulation region 20a located in the inner side of the first substrate 100 is d210, and the width of the second encapsulation region 20b located in the outer side of the first substrate 100 is d220. In an exemplary embodiment, d210 may be two-sevenths d200, and d220 may be five-sevenths d200. In an exemplary embodiment, d210 may be about 200 μm, and d220 may be about 500 μm.

A distance between the first encapsulation region 20a and the antenna 540 may be smaller than the width of the antenna 540 which overlaps the second encapsulation region 20b. In FIG. 2, the distance between the first encapsulation region 20a and the antenna 540 is d221, and the width of the antenna 540 which overlaps the second encapsulation region 20b is d222. In an exemplary embodiment, d221 may be smaller than d222. However, the invention is not limited thereto, and d221 may be substantially equal to d222.

A vertical width of the antenna 540 may be greater than a distance between the antenna 540 and the edge of the first substrate 100. In FIG. 2, the vertical width of the antenna 540 is d400, and the distance between the antenna 540 and the edge of the first substrate 100 is d500. In an exemplary embodiment, d400 may be two to five times d500. However, the invention is not limited to, and d400 may be, for example, about 500 μm. In another exemplary embodiment, d500 may be zero. That is, an edge of the antenna 540 may lie in the same plane with the edge of the first substrate 100. In FIG. 2, a distance by which the antenna 540 protrudes from the second encapsulation region 20b is d410, and d410 may be, for example, about 250 μm.

The buffer layer 120 may be disposed on the first substrate 100. The buffer layer 120 may be located in the pixel region 10 and the encapsulation region 20 of the first substrate 100. The buffer layer 120 disposed in the pixel region 10 may not be patterned, but the buffer layer 120 disposed in the encapsulation region 20 may be patterned. In an exemplary embodiment, holes may be defined in the buffer layer 120 disposed in the encapsulation region 20, as in the gate insulating layer 160 and the interlayer insulating film 200 which will be described later. The buffer layer 120 may effectively prevent the diffusion of metallic atoms, impurities, etc. from the first substrate 100. When the surface of the first substrate 100 is not even, the buffer layer may improve the flatness of the surface of the first substrate 100. The buffer layer 120 may include a silicon material such as silicon oxide, silicon nitride, silicon oxynitride, silicon oxycarbide, silicon carbonitride, etc. These materials may be used alone or in combination. In other exemplary embodiments, the buffer layer 120 may have a single layer structure or a multilayer structure including a silicon material. In an exemplary embodiment, the buffer layer 120 may include a silicon oxide layer, a silicon nitride layer, a silicon oxynitride layer, a silicon oxycarbide layer, and/or a silicon carbonitride layer. In another exemplary embodiment, the buffer layer 120 can be omitted, depending on the surface flatness, material, etc. of the first substrate 100.

The semiconductor pattern 140 may be disposed on the buffer layer 120. Specifically, the semiconductor pattern 140 may be located in the pixel region 10 of the first substrate 100. In an exemplary embodiment, the semiconductor pattern 140 may include amorphous semiconductor, microcrystalline semiconductor, or polycrystalline semiconductor. Preferably, the semiconductor pattern 140 may include polycrystalline semiconductor. The semiconductor pattern 140 may also include oxide semiconductor. The semiconductor pattern 140 may include a channel portion undoped with impurities and p+-doped source and drain portions which are disposed on both end sides of the channel portion. Here, an ion material used to dope the source and drain portions may be P-type impurities such as boron (B). In an exemplary embodiment, diborane (B2H6) may be used. The impurities may vary according to the type of a TFT.

The gate insulating layer 160 may be disposed on the buffer layer 120 to cover the semiconductor pattern 140. The gate insulating layer 160 may be located in the pixel region 10 and the encapsulation region 20 of the first substrate 100. The gate insulating layer 160 disposed in the pixel region 10 may not be patterned, but the gate insulating layer 160 disposed in the encapsulation region 20 may be patterned. In an exemplary embodiment, holes may be defined in the gate insulating layer 160 disposed in the encapsulation region 20, as in the buffer layer 120 described above and the interlayer insulating film 200 which will be described later. The gate insulating layer 160 may include silicon oxide (SiOx), silicon nitride (SiNx), or metal oxide. In an exemplary embodiment, the metal oxide of the gate insulating layer 160 may include hafnium oxide (HfOx), aluminum oxide (AlOx), zirconium oxide (ZrOx), titanium oxide (TiOx), and tantalum oxide (TaOx). These materials may be used alone or in combination. The gate insulating layer 160 may be disposed on the buffer layer 120 to a substantially uniform thickness along a profile of the semiconductor pattern 140. The gate insulating layer 160 may be relatively thin and may have a step portion defined adjacent to the semiconductor pattern 140. In other exemplary embodiments, the gate insulating layer 160 may have a substantially flat top surface while fully covering the semiconductor pattern 140. In this case, the gate insulating layer 160 may be relatively thick.

The gate electrode 180 may be disposed on the gate insulating layer 160. The gate electrode 180 may be located in the pixel region 10 of the first substrate 100. The gate electrode 180 may be disposed on a portion of the gate insulating layer 160 under which the semiconductor pattern 140 is located. In an exemplary embodiment, the gate electrode 180 may include a metal, an alloy, metal nitride, conductive metal oxide, a transparent conductive material, etc. In an exemplary embodiment, the gate electrode 180 may include aluminum (Al), an aluminum-containing alloy, aluminum nitride (AlNx), silver (Ag), a silver-containing alloy, tungsten (W), tungsten nitride (WNx), copper (Cu), a copper-containing alloy, nickel (Ni), chrome (Cr), chrome nitride (CrOx), molybdenum (Mo), a molybdenum-containing alloy, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide ("ITO"), tin oxide (SnOx), indium oxide (InOx), gallium oxide (GaOx), indium zinc oxide ("IZO"), etc. These materials may be used alone or in combination. According to exemplary embodiments, the gate electrode 180 may have a single layer structure including the metal, the alloy, the metal nitride, the conductive metal oxide, or the transparent conductive material described above. Otherwise, the gate electrode 180 may have a multilayer structure including the metal, the alloy, the metal nitride, the conductive metal oxide, and/or the transparent conductive material. In exemplary embodiments, the gate electrode 180 may be substantially narrower than the semiconductor pattern 140. In an exemplary embodiment, a width of the gate electrode 180 may be substantially equal or similar to that of the channel portion. In addition, the gate electrode 180 and the channel portion may overlap each other. However, the dimensions of the gate electrode 180 and/or the dimensions of the channel portion may vary according to electrical characteristics required of a switching device including the gate electrode 180 and the channel portion.

The interlayer insulating film 200 may be disposed on the gate insulating layer 160 to cover the gate electrode 180. The interlayer insulating film 200 may be disposed in the pixel region 10 and the encapsulation region 20 of the first substrate 100. The interlayer insulating film 200 disposed in the pixel region 10 may not be patterned, but the interlayer insulating film 200 disposed in the encapsulation region 20 may be patterned. In an exemplary embodiment, holes may be defined in the interlayer insulating film 200 disposed in the encapsulation region 20, as in the buffer layer 120 and the gate insulating layer 160 described above. Here, the holes defined in the buffer layer 120, the holes defined in the gate insulating layer 160, and the holes defined in the interlayer insulating film 200 may all overlap each other to provide the openings 580. The interlayer insulating film 200 may be disposed on the gate insulating layer 160 to a substantially uniform thickness along a profile of the gate electrode 180. Therefore, the interlayer insulating film 200 may have a step portion provided adjacent to the gate electrode 180. The interlayer insulating film 200 may include a silicon material such as silicon oxide, silicon nitride, silicon oxynitride, silicon carbonitride, silicon oxycarbide, etc. These materials may be used alone or in combination. In addition, the interlayer insulating film 200 may have a single layer structure or a multilayer structure including silicon oxide, silicon nitride, silicon oxynitride, silicon carbonitride, silicon oxycarbide, etc. Further, the interlayer insulating film 200 may include substantially the same material as the gate insulating layer 160. The interlayer insulating film 200 may insulate the gate electrode 180 from a source electrode 240 and a drain electrode 260 which will be provided subsequently.

The contact holes 220 which partially expose the semiconductor pattern 140 are defined in the interlayer insulating film 200. The contact holes 220 may be located in the pixel region 10 of the first substrate 100. In an exemplary embodiment, the contact holes 220 may expose the source portion and the drain portion of the semiconductor pattern 140. When the gate insulating layer 160 is disposed on the semiconductor pattern 140 as in the exemplary embodiment of FIG. 1, the contact holes 220 may be defined to penetrate through the gate insulating layer 160. The contact holes 220 may extend in a direction perpendicular to the surface of the first substrate 100. In addition, the contact holes 220 may be defined at the same time as the openings 580.

The source electrode 240 and the drain electrode 260 may be disposed on the interlayer insulating film 200. Specifically, the source electrode 240 and the drain electrode 260 may be inserted into the contact holes 220, respectively. That is, the source electrode 240 and the drain electrode 260 may be disposed in the pixel region 10 of the first substrate 100.

The source electrode 240 and the drain electrode 260 may be separated by a predetermined distance with respect to the gate electrode 180 and may be disposed adjacent to the gate electrode 180. In an exemplary embodiment, the source electrode 240 and the drain electrode 260 may penetrate through the interlayer insulating film 200 and the gate insulating layer 160 so as to contact the source portion and the drain portion of the semiconductor pattern 140, respectively. Each of the source electrode 240 and the drain electrode 260 include a metal, an alloy, metal nitride, conductive metal oxide, a transparent conductive material, etc. In an exemplary embodiment, each of the source electrode 240 and the drain electrode 260 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. Each of the source electrode 240 and the drain electrode 260 may have a single layer structure or a multilayer structure including the metal, the alloy, the metal nitride, the conductive metal oxide, or the transparent conductive material described above. The formation of the source electrode 240 and the drain electrode 260 on the interlayer insulating film 200 may provide a TFT, which includes the semiconductor pattern 140, the gate insulating layer 160, the gate electrode 180, the source electrode 240 and the drain electrode 260, on the first substrate 100 as a switching device of the OLED. As described above, the TFT may be a top gate TFT. However, the invention is not limited thereto, and the TFT may also be a bottom gate TFT.

The intermediate layer 280 may be disposed on the source electrode 240 and the drain electrode 260. That is, the intermediate layer 280 may be disposed on the interlayer insulating film 200 to cover the source electrode 240 and the drain electrode 260. The intermediate layer 280 may be disposed in the pixel region 10 of the first substrate 100. The intermediate layer 280 may be thick enough to completely cover the source electrode 240 and the drain electrode 260. The intermediate layer 280 may include an organic material or an inorganic material. In an exemplary embodiment, the intermediate layer 280 may include photoresist, acrylic-based polymer, polyimide-based polymer, polyamide-based polymer, siloxane-based polymer, polymer containing photosensitive acryl carboxyl, novolak resin, alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in combination. According to other exemplary embodiments, the intermediate layer 280 that covers the TFT may not be provided, depending on the material, dimensions, etc. of the planarization layer 300 which will be provided subsequently.

The planarization layer 300 may be disposed on the intermediate layer 280. The planarization layer 300 may be disposed in the pixel region 10 of the first substrate 100. A surface of the planarization layer 300 may be flat. That is, the planarization layer 300 may be provided thick enough to planarize its surface on which pixels are to be located. The planarization layer 300 may include an insulating material. In addition, the planarization layer 300 may include an organic material such as polyimide. Further, the planarization layer 300 may have a single layer structure or a multilayer structure including two or more insulating layers.

The via hole 320 that partially exposes the drain electrode 260 may be defined in the planarization layer 300. In an exemplary embodiment, the via hole 320 may expose a central portion of the drain electrode 260. The via hole 320 may extend in the direction perpendicular to the surface of the first substrate 100.

The first electrode 340 may be positioned on the planarization layer 300. The first electrode 340 may be disposed in the pixel region 10 of the first substrate 100. The first electrode 340 may be inserted into the via hole 320 so as to be electrically connected to the drain electrode 260. The first electrode 340 may be an anode or a cathode. When the first electrode 340 is an anode, the second electrode 400 may be a cathode. Thus, exemplary embodiments of the invention will be described below based on this assumption. However, the first electrode 340 may also be a cathode, and the second electrode 400 may also be an anode.

To be used as an anode, the first electrode 340 may include a conductive material with a high work function. When the OLED is of a bottom emission type, the first electrode 340 may include a material such as ITO, IZO, ZnO or In2O3 or may include a stacked layer of these materials. When the OLED is of a top emission type, the first electrode 340 may further include a reflective layer including Ag, Mg, Al, Pt, Pd, Au, Ni, Nd, Ir, Cr, Li or Ca. The first electrode 340 can be modified in various ways to have, for example, a structure including two or more layers provided using two or more different materials selected from the above materials.

The pixel defining layer 360 may be disposed on the first electrode 340. The pixel defining layer 360 may be disposed in the pixel region 10 of the first substrate 100. The pixel defining layer 360 may partially expose the first electrode 340. The pixel defining layer 360 may include at least one organic material selected from benzocyclobutene ("BCB"), polyimide (PI), polyamaide (PA), acrylic resin and phenolic resin or an inorganic material such as silicon nitride. The pixel defining layer 360 may also include a photosensitizer that contains a black pigment. In this case, the pixel defining layer 360 may serve as a light-blocking member.

The organic light-emitting layer 380 is disposed on the first electrode 340. The organic light-emitting layer 380 may be disposed in the pixel region 10 of the first substrate 100. In response to an electric current supplied to the organic light-emitting layer 380, electrons and holes within the organic light-emitting layer 380 may recombine to form excitons, and energy from the excitons may generate light of a certain wavelength.

The organic light-emitting layer 380 may include a small molecular weight organic material or a polymer organic material. The organic light-emitting layer 380 may include a hole-injection layer ("HIL"), a hole-transporting layer ("HTL"), a hole-blocking layer ("HBL"), an emitting layer ("EML), an electron-transporting layer ("ETL"), an electron-injection layer ("EIL"), and an electron-blocking layer ("EBL").

The second electrode 400 may be disposed on the organic light-emitting layer 380. The second electrode 400 may be disposed in the pixel region 10 of the first substrate 100. To be used as a cathode, the second electrode 400 may include a conductive material with a low work function. In an exemplary embodiment, the second electrode 400 may include Ag, Mg, Al, Pt, Pd, Au, Ni, Nd, Ir, Cr, Li or Ca. The formation of the second electrode 400 on the organic light-emitting layer 380 may provide an organic light-emitting device, which includes the first electrode 340, the organic light-emitting layer 380 and the second electrode 400, on the first substrate 100 as a display device of the OLED.

The cover layer 420 may be disposed on the second electrode 400. The cover layer 420 may be disposed in the pixel region 10 of the first substrate 100. In an exemplary embodiment, the cover layer 420 may directly contact top surfaces of the second electrode 400 and the interlayer insulating film 200 and vertical surfaces of the second electrode 400, the pixel defining layer 360, the planarization layer 300 and the intermediate layer 280. The cover layer 420 may protect the organic light-emitting device from external moisture or oxygen, thereby effectively preventing degradation of the organic light-emitting device.

The cover layer 420 may be an organic layer, an inorganic layer, or a multilayer including the organic layer and the inorganic layer. The inorganic layer may be an insulating layer such as a silicon oxide (SiO2) layer, a silicon nitride (SiNx) layer, or a silicon oxynitride (SiOxNy) layer. Also, the inorganic layer may be a LiF layer. The organic layer may be a layer including NPB(N,N'-Bis(naphthalen-1-yl)-N,N'-bis(phenyl)benzidine), TNATA, TCTA, TDAPB, TDATA, Alq3, Balq or CBP. The cover layer 420 may be provided by evaporation, chemical vapor deposition ("CVD"), or sputtering.

The second substrate 440 may be positioned on the cover layer 420. The second substrate 440 may be separated from the cover layer 420 by a predetermined distance. In an exemplary embodiment, a space between the second substrate 440 and the cover layer 420 may be filled with nitrogen, etc. The second substrate 440 may face the first substrate 100. The second substrate 440 may be positioned to cover both the pixel region 10 and the encapsulation region 20 of the first substrate 100. In an exemplary embodiment, the second substrate 440 may encapsulate the organic light-emitting device and the TFT, together with the sealant 460.

In an exemplary embodiment, the second substrate 440 may be transparent insulating glass or plastic, but is not limited thereto, and may include various materials that can block external substances. In an exemplary embodiment, the second substrate 440 may include the same material as the first substrate 100.

The sealant 460 may be interposed between the first substrate 100 and the second substrate 440. In addition, the sealant 460 may be located in the edge portion of each of the first substrate 100 and the second substrate 440. In an exemplary embodiment, the sealant 460 may be located in the encapsulation region 20 of the first substrate 100. In addition, the sealant 460 may not exist in the pixel region 10 of the first substrate 100. The sealant 460 may contact the first substrate 100, the buffer layer 120, the gate insulating layer 160, and/or the interlayer insulating film 200. However, the invention is not limited thereto, and the sealant 460 may also contact the dummy metal 560. The sealant 460 may encapsulate the organic light-emitting device and the TFT. That is, the sealant 460 may effectively prevent oxygen and moisture from penetrating into the organic light-emitting device and the TFT.

The adhesive layer 480 may be disposed on the second substrate 440. Specifically, the adhesive layer 480 may be located in a surface of the second substrate 440 which does not face the organic light-emitting device. The adhesive layer 480 may fully cover the surface of the second substrate 440. In an exemplary embodiment, the adhesive layer 480 may include a transparent adhesive material. In an exemplary embodiment, the adhesive layer 480 may include photo-curable resin and/or thermosetting resin.

The window 500 may be disposed on the adhesive layer 480. The window 500 may be coupled to the second substrate 440 by the adhesive layer 480. The window 500 may be manufactured large enough to fully cover the first substrate 100 and the second substrate 440. In an exemplary embodiment, an edge portion of the window 500 may protrude from the first substrate 100 and the second substrate 440 when viewed from above. The window 500 may include a transparent material. In an exemplary embodiment, the window 500 may include tempered glass.

The support layer 520 may be disposed under the first substrate 100. Specifically, the support layer 520 may be disposed on a surface of the first substrate 100 which does not face the organic light-emitting device. That is, the first substrate 100 may be disposed between the support layer 520 and the organic light-emitting device. The support layer 520 may support structures disposed thereon, such as the first substrate 100, the TFT, the organic light-emitting device, the second substrate 440, etc. and protect the above structures from external impact.

The support layer 520 may include a conductive material. The support layer 520 may include a metal such as copper (Cu). However, the invention is not limited thereto, and the support layer 520 may include various metal materials or polymer materials. The support layer 520 may be disposed in the pixel region 10 and the first encapsulation region 20a. In addition, the support layer 520 may not be disposed on the second encapsulation region 20b. That is, an edge portion of the support layer 520 may overlap the dummy metal 560 but may not overlap the antenna 540.

The antenna 540 may be disposed on the first substrate 100. The antenna 540 may disposed in and/or on the same plane with the support layer 520. That is, the antenna 540 may be disposed on the surface of the first substrate 100 which does not face the organic light-emitting device. In addition, the antenna 540 may be disposed directly on the first substrate 100. In other words, other elements such as the support layer 520 may not be interposed between the antenna 540 and the first substrate 100. At least a portion of the antenna 540 may be disposed on the second encapsulation region 20b. The antenna 540 may not overlap the first encapsulation region 20a. In other words, the antenna 540 may not overlap the dummy metal 560.

The dummy metal 560 may be interposed between the first substrate 100 and the sealant 460. In addition, the dummy metal 560 may be disposed on the first encapsulation region 20a. In an exemplary embodiment, the dummy metal 560 may be interposed between the gate insulating layer 160 and the interlayer insulating film 200 and thus surrounded by the gate insulating layer 160 and the interlayer insulating film 200. However, the invention is not limited thereto. The dummy metal 560 may overlap the support layer 520. However, the dummy metal 560 may not overlap the antenna 540. That is, when viewed from above, the dummy metal 560 and the antenna 540 may be separated from each other by a certain distance.

The dummy metal 560 may cover the whole of the first encapsulation region 20a or may be patterned on the first encapsulation region 20a as shown in FIG. 2. In an exemplary embodiment, one or more holes are defined in the dummy metal 560, and the holes of the dummy metal may overlap the openings 580. In other words, the holes of the dummy metal 560 may overlap the holes of the buffer layer 120, the holes of the gate insulating layer 160, and the holes of the interlayer insulating film 200. Here, the holes of the dummy metal 560 may be larger than the holes of the buffer layer 120, the holes of the gate insulating layer 160, and the holes of the interlayer insulating film 200. That is, only central portions of the holes of the dummy metal 560 may overlap the holes of the buffer layer 120, the holes of the gate insulating layer 160, and the holes of the interlayer insulating film 200.

In an exemplary embodiment, the dummy metal 560 may include a metal, an alloy, metal nitride, conductive metal oxide, a transparent conductive material, etc. In an exemplary embodiment, the dummy metal 560 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. According to exemplary embodiments, the dummy metal 560 may have a single layer structure including the metal, the alloy, the metal nitride, the conductive metal oxide, or the transparent conductive material described above. Otherwise, the dummy metal 560 may have a multilayer structure including the metal, the alloy, the metal nitride, the conductive metal oxide, and/or the transparent conductive material.

The dummy metal 560 may include the same material as the gate electrode 180. In an exemplary embodiment, the dummy metal 560 may be patterned at the same time as the gate electrode 180. In addition, the gate electrode 180 and the dummy metal 560 may be provided using the same mask.

The openings 580 may be defined in the encapsulation region 20. Specifically, the openings 580 may include holes that penetrate through the buffer layer 120, the gate insulating layer 160 and the interlayer insulating film 200. That is, the openings 580 may partially expose the first substrate 100. The openings 580 may be shaped like regular hexahedrons. However, the invention is not limited thereto, and the openings 580 can have various shapes. When viewed from above, the openings 580 may be rectangular. In addition, the openings 580 may be arranged in a matrix pattern in the encapsulation region 20.

The opening 580 may include a plurality of first openings 580a and a plurality of second openings 580b.

The first openings 580a may be defined in the first encapsulation region 20a. The first openings 580a may be arranged at regular intervals. In an exemplary embodiment, the first openings 580a may be arranged in a matrix pattern. However, the arrangement pattern of the first openings 580a is not limited to the matrix pattern, and the first openings 580a can be arranged in various patterns. In addition, the first openings 580a may overlap the holes of the dummy metal 560. However, the first openings 580a may not overlap the antenna 540. In another exemplary embodiment, the first openings 580a can be omitted when necessary.

The second openings 580b may be defined in the second encapsulation region 20b. The second openings 580b may be arranged at regular intervals. In an exemplary embodiment, the second openings 580b may be arranged in a matrix pattern. However, the arrangement pattern of the second openings 580b is not limited to the matrix pattern, and the second openings 580b can be arranged in various patterns. In addition, the second openings 580b may not overlap the holes of the dummy metal 560. However, the second openings 580b may overlap at least part of the antenna 540.

A size of the first openings 580a may be different from a size of the second openings 580b. In an exemplary embodiment, the first openings 580a may be larger than the second openings 580b. In an exemplary embodiment, a height of the first openings 580a vertically extended in a cross-sectional view may be substantially equal to that of the second openings 580b vertically extended in the cross-sectional view. However, a width of the first openings 580a may be greater than that of the second openings 580b. In other words, a volume of the first openings 580a represented by a planar area thereof multiplied by the height thereof may be greater than that of the second openings 580b represented by a planar area thereof multiplied by the height thereof. Here, the volume of the first opening 580a and the volume of the second opening 580b may be a volume of a space surrounded by the first substrate 100 and the insulating layers such as the buffer layer 120, the gate insulating layer 160 and the interlayer insulating film 200. In addition, a distance between adjacent first openings 580a may be greater than a distance between adjacent second openings 580b.

An area ratio of the second openings 580b may be defined as a ratio of a total area of vertical surfaces S2 of the second openings 580b in a cross-section to a planar area of the second encapsulation region 20b, and an area ratio of the first openings 580a may be defined as a ratio of a total area of vertical surfaces S1 of the first openings 580a to a planar area of the first encapsulation region 20a. In this case, the area ratio of the second openings 580b may be different from that of the first openings 580a. In an exemplary embodiment, the area ratio of the second openings 580b may be greater than that of the first openings 580a. In an exemplary embodiment, the area ratio of the second openings 580b may be about 3% to about 80%, and the area ratio of the first openings 580a may be about 0% to about 3%. In another exemplary embodiment, the area ratio of the second openings 580b may be about 6% to about 16%, and the area ratio of the first openings 580a may be about 0% to about 6%. In another exemplary embodiment, the area ratio of the second openings 580b may be about 10% to about 15%, and the area ratio of the first openings 580a may be about 0% to about 10%.

The OLED according to the illustrated exemplary embodiment can guarantee a certain degree of mechanical strength and improve transmission and reception sensitivity of the antenna 540. This will be described in more detail below.

When the sealant 460 alone is interposed between the first substrate 100 and the second substrate 440 of the OLED, there may be limitations on the mechanical strength of the OLED. Therefore, the dummy metal 560 may additionally be interposed between the sealant 460 and the first substrate 100 to improve the mechanical strength of the OLED. Specifically, when the sealant 460 is fused by irradiating a laser beam to the sealant 460, part of the energy of the laser beam may be delivered to the dummy metal 560 interposed between the sealant 460 and the first substrate 100. Then, the dummy metal 560 which receives part of the energy of the laser beam may deliver part of the received energy to the sealant 460. Therefore, the efficiency of the energy delivered from the laser beam to the sealant 460 can be increased. The sealant 460 which receives substantial thermal energy in this way may substantially expand. In particular, the sealant 460 may expand more at its contact portion with the dummy metal 560. When the sealant 460 expands more, a contact area between the sealant 460 and each of the first substrate 100 and the second substrate 440 may increase, thereby improving the mechanical strength of the OLED. In addition, when the sealant 460 is cooled after being irradiated with the laser beam, the dummy metal 560 may effectively reduce the cooling speed of the sealant 460. Therefore, the dummy metal 560 can effectively prevent a defect caused by the rapid cooling of the sealant 460.

However, when the antenna 540 of the OLED is disposed on the dummy metal 560, the transmission and reception function of the antenna 540 may be effectively reduced. That is, while the dummy metal 560 can improve the mechanical strength of the OLED, it can effectively reduce the transmission and reception sensitivity of the antenna 540.

Therefore, in the OLED according to the illustrated exemplary embodiment, the dummy metal 560 is not provided in a region which overlaps the antenna 540 in order to improve the transmission and reception sensitivity of the antenna 540. In addition, the support layer 520 is not provided in the region which overlaps the antenna 540 to further improve the transmission and reception sensitivity of the antenna 540. That is, since the antenna 540 is disposed directly on the second encapsulation region 20b of the first substrate 100, its unique function can be ensured.

The dummy metal 560 is left in a region on an inner side of the sealant 460 to ensure a certain degree of mechanical strength of the OLED. Specifically, impact applied to the OLED imposes relatively more stress on the region on the inner side of the sealant 460 than on a region on an outer side of the sealant 460. This is because the sealant 460 fixes edges of the first substrate 100 and the second substrate 440. Thus, when external impact is applied to the first substrate 100 or the second substrate 440, the resultant vibrational energy is generated more in a central portion of the first substrate 100 or the second substrate 440. For this reason, the dummy metal 560 is left only in the first encapsulation region 20a but not in the second encapsulation region 20b. Consequently, it is possible to ensure a certain degree of mechanical strength of the OLED required by a user.

The area ratio of the second openings 580b in the encapsulation region 20 where the dummy metal 560 is not present, that is, the second encapsulation region 20b may be maximized to increase the contact area of the sealant 460, thereby further improving the mechanical strength of the OLED. That is, a reduction in the mechanical strength of the OLED due to the absence of the dummy metal 560 in the second encapsulation region 20b can be compensated for by maximizing the area ratio of the second openings 580b.

Figure 5:
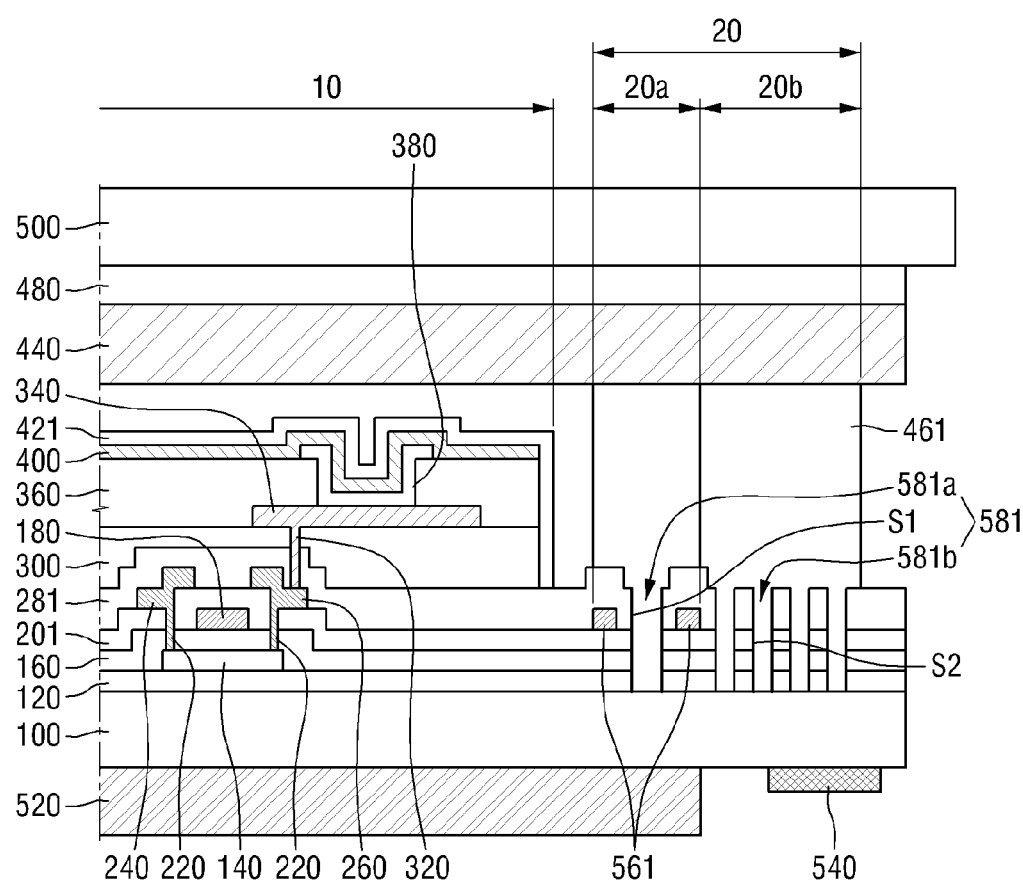
FIGS. 5 and 6 are cross-sectional views of another exemplary embodiment of an OLED according to the invention.
Figure 6:
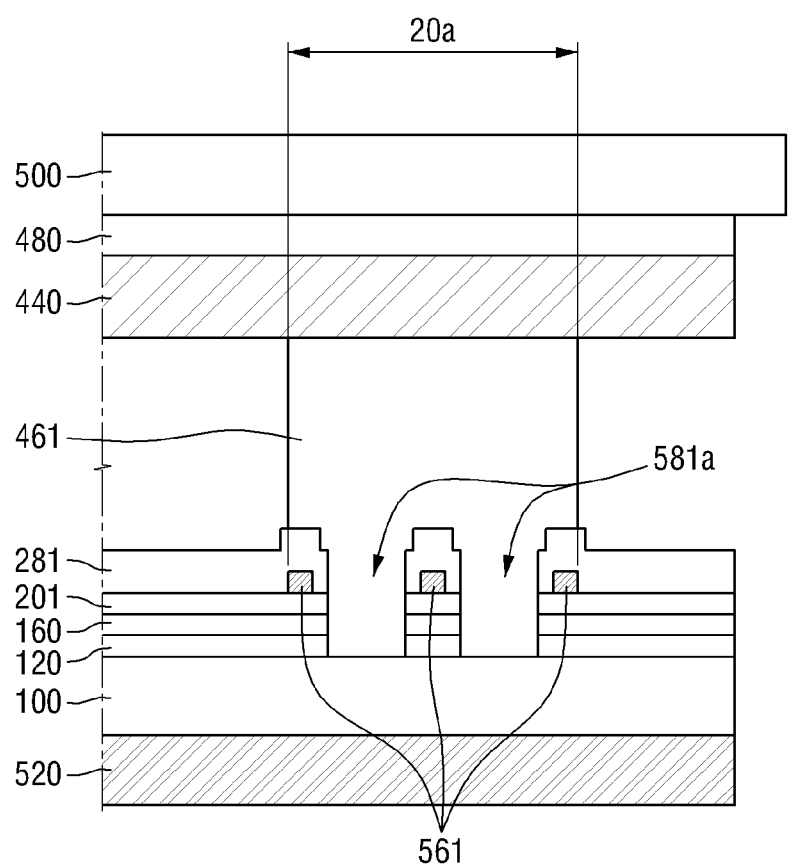

An OLED according to another exemplary embodiment of the invention will now be described with reference to FIGS. 5 and 6. FIGS. 5 and 6 are cross-sectional views of an OLED according to another exemplary embodiment of the invention. For simplicity, elements substantially identical to those of FIGS. 3 and 4 are indicated by like reference numerals, and thus a redundant description thereof will be omitted.

FIG. 5 corresponds to FIG. 3, and FIG. 6 corresponds to FIG. 4. Referring to FIGS. 5 and 6, a dummy metal 561 of the OLED according to the illustrated exemplary embodiment may be interposed between an interlayer insulating film 201 and an intermediate layer 281. That is, the intermediate layer 281 may be disposed not only on a pixel region 10 but also on an encapsulation region 20, and the dummy metal 561 may be surrounded by the interlayer insulating film 201 and the intermediate layer 281. Accordingly, a cover layer 421 may contact a top surface of the intermediate layer 281.

The dummy metal 561 may include a metal, an alloy, metal nitride, conductive metal oxide, a transparent conductive material, etc. In an exemplary embodiment, the dummy metal 561 may include aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. According to exemplary embodiments, the dummy metal 560 may have a single layer structure including the metal, the alloy, the metal nitride, the conductive metal oxide, or the transparent conductive material described above. The dummy metal 561 may include the same material as a source electrode 240 and/or a drain electrode 260. In addition, the dummy metal 561 may be provided at the same time as the source electrode 240 and/or the drain electrode 260.

Openings 581 may include a plurality of first openings 581*a* and a plurality of second openings 581*b*. The first openings 581*a* and the second openings 581*b* may be defined by overlapping of holes of a buffer layer 120, holes of a gate insulating layer 160, holes of the interlayer insulating film 201, and holes of the intermediate layer 281. Accordingly, a height of the first openings 581*a* and a height of the second openings 581*b* may increase, thereby increasing an area ratio of the first openings 581*a* and an area ratio of the second openings 581*b*. That is, a contact area of a sealant 461 may increase.

Figure 7:
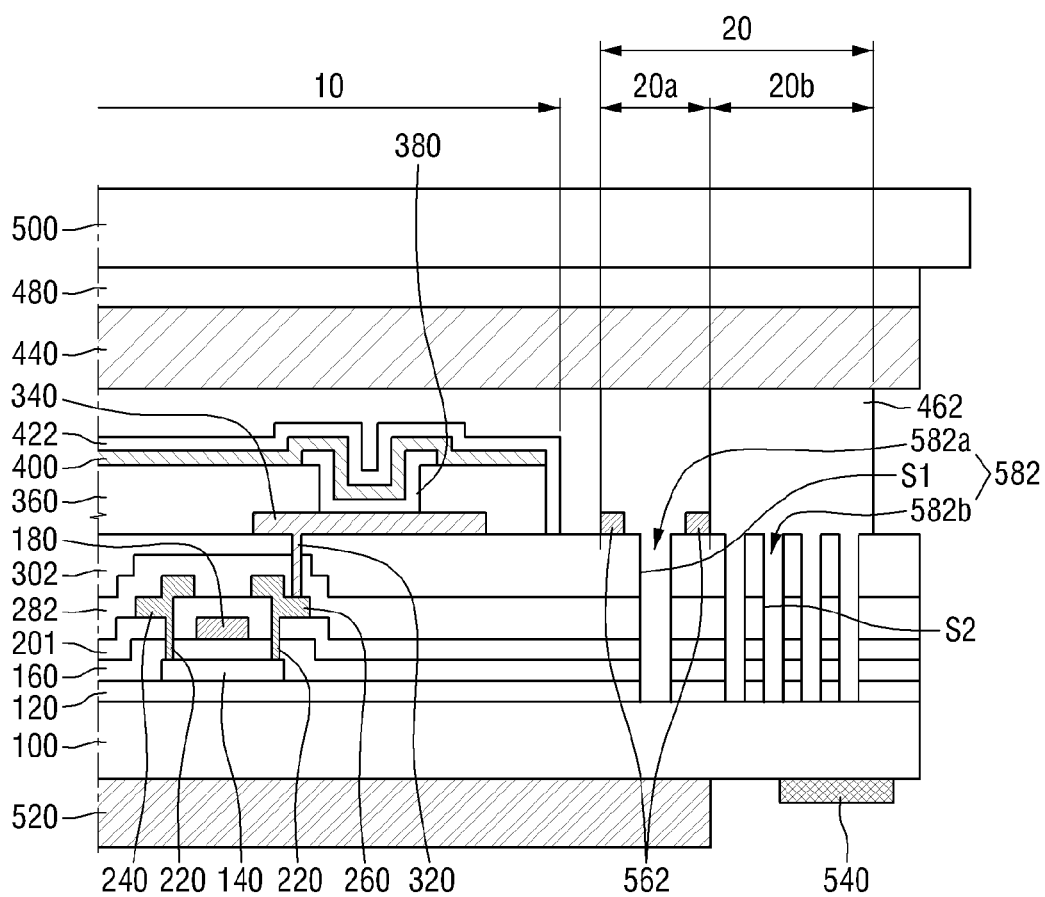
FIGS. 7 and 8 are cross-sectional views of another exemplary embodiment of an OLED according to the invention.
Figure 8:
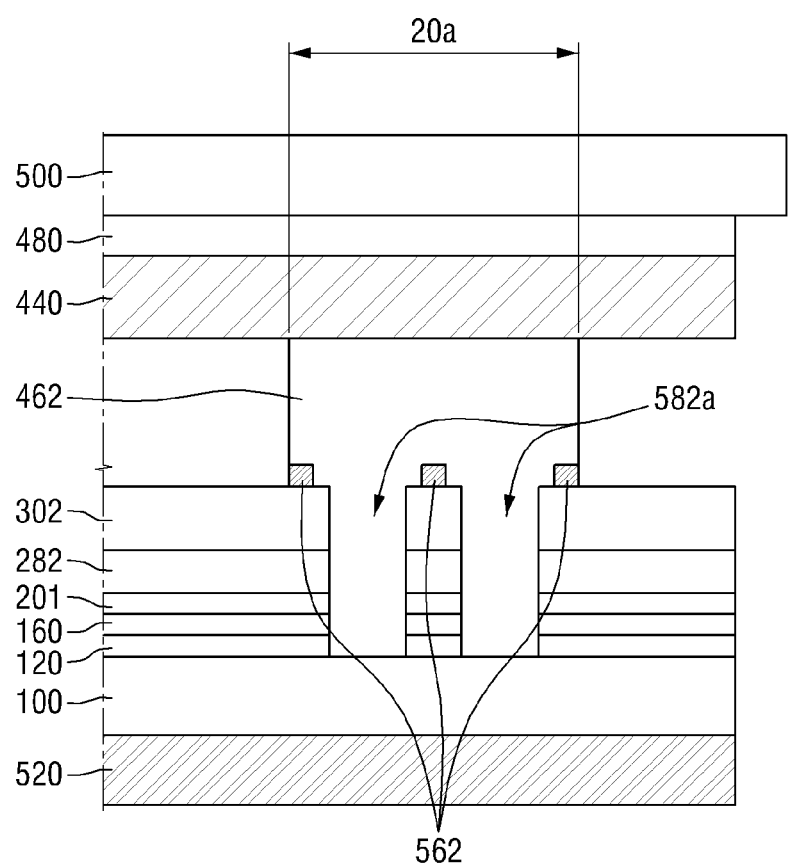

An OLED according to another exemplary embodiment of the invention will now be described with reference to FIGS. 7 and 8. FIGS. 7 and 8 are cross-sectional views of an OLED according to another exemplary embodiment of the invention. For simplicity, elements substantially identical to those of FIGS. 3 through 6 are indicated by like reference numerals, and thus a redundant description thereof will be omitted.

FIG. 7 corresponds to FIG. 3, and FIG. 8 corresponds to FIG. 4. Referring to FIGS. 7 and 8, a dummy metal 562 of the OLED according to the illustrated exemplary embodiment may be disposed on a planarization layer 302. That is, the planarization layer 302 may be disposed not only on a pixel region 10 but also on an encapsulation region 20, and the dummy metal 562 may be disposed on the planarization layer 302. In this case, the dummy metal 562 may not be surrounded by insulating layers but may directly contact a sealant 462. Accordingly, a cover layer 422 may contact a top surface of the planarization layer 302.

The dummy metal 562 may include a material such as ITO, IZO, ZnO or In2O3 or may include a stacked layer of these materials. Alternatively, the dummy metal 562 may include Ag, Mg, Al, Pt, Pd, Au, Ni, Nd, Ir, Cr, Li or Ca. The dummy metal 562 may have a structure including two or more layers provided using two or more different materials selected from the above materials. The dummy metal 562 may include the same material as a first electrode 340. In addition, the dummy metal 562 may include the same time as the first electrode 340. Although not shown in the drawings, the dummy metal 562 may include the same material as a second metal.

Openings 582 may include a plurality of first openings 582*a* and a plurality of second openings 582*b*. The first openings 582*a* and the second openings 582*b* may be defined by overlapping of holes of a buffer layer 120, holes of a gate insulating layer 160, holes of an interlayer insulating film 201, holes of an intermediate layer 282, and holes of the planarization layer 302. Accordingly, a height of the first openings 582*a* vertically extended in a cross-sectional view and a height of the second openings 582*b* vertically extended in the cross-sectional view may increase, thereby increasing an area ratio of the first openings 582*a* and an area ratio of the second openings 582*b*. That is, a contact area of the sealant 462 may increase. In addition, the first openings 582*a* and the second openings 582*b* may be defined at the same time as a via hole 320.

Figure 9:
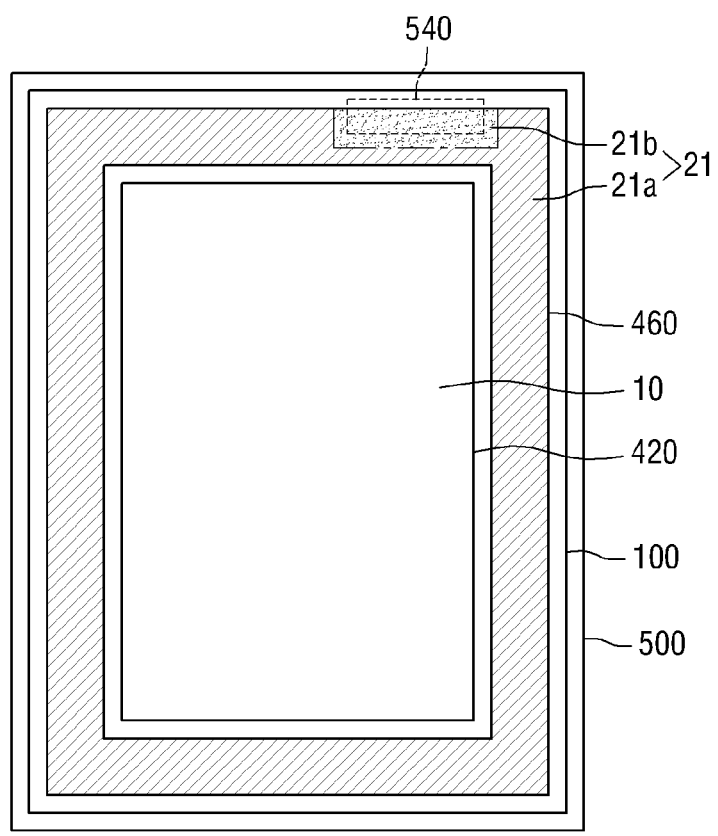

An OLED according to another exemplary embodiment of the invention will now be described with reference to FIG. 9. FIG. 9 is a plan view of an OLED according to another exemplary embodiment of the invention. For simplicity, elements substantially identical to those of FIG. 1 are indicated by like reference numerals, and thus a redundant description thereof will be omitted.

Referring to FIG. 9, an encapsulation region 21 of the OLED according to the illustrated exemplary embodiment may include a first encapsulation region 21*a* and a second encapsulation region 21*b*, and the first encapsulation region 21*a* may surround an antenna 540. In other words, the second encapsulation region 21*b* may be provided only in a region which overlaps the antenna 540 and a region which is adjacent to the antenna 540.

An OLED according to another exemplary embodiment of the invention will now be described with reference to FIG. 10. FIG. 10 is a plan view of an OLED according to another exemplary embodiment of the invention. For simplicity, elements substantially identical to those of FIG. 1 are indicated by like reference numerals, and thus a redundant description thereof will be omitted.

Referring to FIG. 10, an encapsulation region 22 of the OLED according to the illustrated exemplary embodiment may include a first encapsulation region 22*a* and a second encapsulation region 22*b*, and the first encapsulation region 22*a* may surround an antenna 540. Here, at least a portion of a boundary line between the first encapsulation region 22*a* and the second encapsulation region 22*b* may be shaped like a staircase St. In an exemplary embodiment, the staircase-shaped portion of the boundary line between the first encapsulation region 22*a* and the second encapsulation region 22*b* may be located at a side of the antenna 540 and the other side of the antenna 540 which faces the above side of the antenna 540. In this way, the boundary line between the first encapsulation region 22*a* and the second encapsulation region 22*b* can be adjusted in order to improve the transmission and reception function of the antenna 540.

An OLED according to another exemplary embodiment of the invention will now be described with reference to FIG. 11. FIG. 11 is a plan view of an OLED according to another exemplary embodiment of the invention. For simplicity, elements substantially identical to those of FIG. 1 are indicated by like reference numerals, and thus a redundant description thereof will be omitted.

Referring to FIG. 11, an encapsulation region 23 of the OLED according to the illustrated exemplary embodiment may include a first encapsulation region 23*a* and a second encapsulation region 23*b*. A width of the first encapsulation region 23*a* adjacent to three sides of a first substrate 100 may be smaller than a width of the first encapsulation region 23*a* adjacent to the other side of the first substrate 100. Here, the first encapsulation region 23*a* having the small width may be located adjacent to an antenna 540 but may not overlap the antenna 540.

Exemplary embodiments of the invention provide at least one of the following advantages.

That is, it is possible to ensure a certain degree of mechanical strength of an OLED while improving transmission and reception sensitivity of an antenna.

However, the effects of the invention are not restricted to the one set forth herein. The above and other effects of the invention will become more apparent to one of daily skill in the art to which the invention pertains by referencing the claims.

While the invention has been particularly shown and described with reference to exemplary embodiments thereof, it will be understood by those of ordinary skill in the art that various changes in form and details may be made therein without departing from the spirit and scope of the invention as defined by the following claims. It is therefore desired that the exemplary embodiments be considered in all respects as illustrative and not restrictive, reference being made to the appended claims rather than the foregoing description to indicate the scope of the invention.

What is claimed is:

1. An organic light-emitting display comprising:
    a first substrate which comprises:
        a pixel region; and
        an encapsulation region which surrounds the pixel region;
    an organic light-emitting device which is located in the pixel region;
    a sealant which is located in the encapsulation region;
    a dummy metal which is interposed between the first substrate and the sealant;
    an antenna which is located on the first substrate; and
    an insulating layer which is interposed between the first substrate and the sealant, wherein an opening is defined by the insulating layer, and at least a portion of the antenna overlaps the opening,
    wherein
    the encapsulation region comprises a first encapsulation region, and a second encapsulation region which is contiguous to the first encapsulation region and abutting a periphery of the first encapsulation region,
    the dummy metal is located only in the first encapsulation region between the second encapsulation region and the pixel region
    the organic light-emitting device and the sealant are located on a first surface of the first substrate,
    the antenna is located on a second surface of the first substrate, wherein the second surface of the first substrate faces away from the first surface of the first substrate, and
    at least a portion of the antenna is located in the second encapsulation region.

2. The organic light-emitting display of claim 1, wherein a width of the first encapsulation region in a region of the first substrate is different from a width of the first encapsulation region in another region of the first substrate.

3. The organic light-emitting display of claim 1, wherein the first encapsulation region is located in an inner side of the first substrate, and the second encapsulation region is located in an outer side of the first substrate.

4. The organic light-emitting display of claim 1, wherein a portion of the first encapsulation region is interposed between the pixel region and the second encapsulation region.

5. The organic light-emitting display of claim 1, wherein the dummy metal is not located in the second encapsulation region.

6. The organic light-emitting display of claim 1, further comprising a plurality of openings defined in the insulating layer and comprising:
    a plurality of first openings which is defined in the first encapsulation region; and
    a plurality of second openings which is defined in the second encapsulation region,
    wherein a size of each of the plurality of first openings is different from a size of each of the plurality of second openings.

7. The organic light-emitting display of claim 6, wherein a ratio of a total area of vertical surfaces of the second openings to a planar area of the second encapsulation region is different from a ratio of a total area of vertical surfaces of the first openings to a planar area of the first encapsulation region.

8. The organic light-emitting display of claim 1, wherein the first encapsulation region surrounds the antenna.

9. The organic light-emitting display of claim 8, wherein at least a portion of a boundary line between the first encapsulation region and the second encapsulation region is staircase-shaped.

10. The organic light-emitting display of claim 1, further comprising a support layer which is located on the first substrate, located in the pixel region and the first encapsulation region, and includes a conductive material,
    wherein the organic light-emitting device and the sealant are located in the first surface of the first substrate, and
    the support layer is located in the second surface of the first substrate, wherein the second surface of the first substrate faces away from the first surface of the first substrate.

11. The organic light-emitting display of claim 10, wherein the support layer is not located in the second encapsulation region.

12. The organic light-emitting display of claim 1, wherein the organic light-emitting device comprises:
    a first electrode;
    a second electrode which is located on the first electrode; and
    an organic light-emitting layer which is interposed between the first electrode and the second electrode,
    wherein the dummy metal includes the same material as any one of the first electrode and the second electrode.

13. The organic light-emitting display of claim 1, further comprising a thin-film transistor which is located in the pixel region of the first substrate,
    wherein
    the thin-film transistor comprises a gate electrode, a source electrode and a drain electrode, and
    the dummy metal includes the same material as at least one of the gate electrode, the source electrode and the drain electrode.

14. The organic light-emitting display of claim 1, further comprising a second substrate which faces the first substrate in a plan view and is coupled to the first substrate by the sealant.

15. An organic light-emitting display comprising:
    a substrate which comprises:
        a pixel region; and
        an encapsulation region which surrounds the pixel region;
    an organic light-emitting device which is located in the pixel region;
    a sealant which is located in the encapsulation region;
    a dummy metal which is interposed between the substrate and the sealant;
    an antenna which is located on the substrate; and
    an insulating layer which is interposed between the substrate and the sealant, wherein an opening is defined by the insulating layer, and at least a portion of the antenna overlaps the opening, wherein
a width of a region including the dummy metal in a region of the substrate is smaller than a width of the region including the dummy metal in another region of the substrate,
the encapsulation region comprises a single first encapsulation region, and a single second encapsulation region which is contiguous to the first encapsulation region and abutting a periphery of the first encapsulation region,
the organic light-emitting device and the sealant are located on a first surface of the substrate, and
the antenna is located on a second surface of the substrate, wherein the second surface of the substrate faces away from the first surface of the substrate, and wherein the antenna does not overlap the dummy metal.

16. An organic light-emitting display comprising:
a substrate;
an organic light-emitting device which is located in a first surface of the substrate in a pixel region;
a sealant which is located on the first surface of the substrate and surrounds the organic light-emitting device;
an electrically isolated dummy metal which is interposed between the substrate and the sealant;
an antenna which is located on a second surface of the substrate, wherein the second surface of the substrate faces away from the first surface of the substrate, and wherein the antenna does not overlap the dummy metal; and
an insulating layer which is interposed between the substrate and the sealant, wherein an opening is defined by the insulating layer, and at least a portion of the antenna overlaps the opening.

* * * * *